(12) United States Patent
Searles

(10) Patent No.: US 8,638,145 B2
(45) Date of Patent: Jan. 28, 2014

(54) METHOD FOR LOCKING A DELAY LOCKED LOOP

(75) Inventor: Shawn Searles, Austin, TX (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 28 days.

(21) Appl. No.: 13/529,671

(22) Filed: Jun. 21, 2012

(65) Prior Publication Data

US 2013/0169329 A1    Jul. 4, 2013

Related U.S. Application Data

(60) Provisional application No. 61/581,748, filed on Dec. 30, 2011.

(51) Int. Cl.
   *H03L 7/06* (2006.01)
(52) U.S. Cl.
   USPC .......................................... 327/158; 327/149
(58) Field of Classification Search
   None
   See application file for complete search history.

(56) References Cited

U.S. PATENT DOCUMENTS

| | | | |
|---|---|---|---|
| 5,223,755 A | 6/1993 | Richley | |
| 5,883,534 A | 3/1999 | Kondoh et al. | |
| 6,351,167 B1 | 2/2002 | Hein et al. | |
| 7,348,821 B2 * | 3/2008 | Xu et al. | 327/276 |
| 2002/0017939 A1 | 2/2002 | Okuda et al. | |
| 2002/0027430 A1 | 3/2002 | Eto | |
| 2005/0111291 A1 | 5/2005 | Rao et al. | |
| 2006/0170471 A1 | 8/2006 | Haerle et al. | |
| 2011/0109356 A1 * | 5/2011 | Ali et al. | 327/158 |

FOREIGN PATENT DOCUMENTS

EP        0964517 A2    12/1999

* cited by examiner

*Primary Examiner* — Cassandra Cox
(74) *Attorney, Agent, or Firm* — Volpe and Koenig, P.C.

(57) ABSTRACT

A method and apparatus for synchronizing a delay line to a reference clock includes a delay line that receives a clock input signal based on a reference clock and outputs a delay edge signal according to a control adjustment. An injector receives a first rise edge of the reference clock and in response to a first trigger, sends the clock input signal to the delay line. A synchronizer determines that the rise edge has passed through the delay line, and in response, sends the injector a second trigger to send a next single fall edge of the clock input signal to the delay line. A charge pump determines a timing difference between the delay edge signal and a reference edge signal sent from the injector. The charge pump sends the control signal to the delay line to adjust the delay setting of the delay line based on the timing difference.

19 Claims, 9 Drawing Sheets

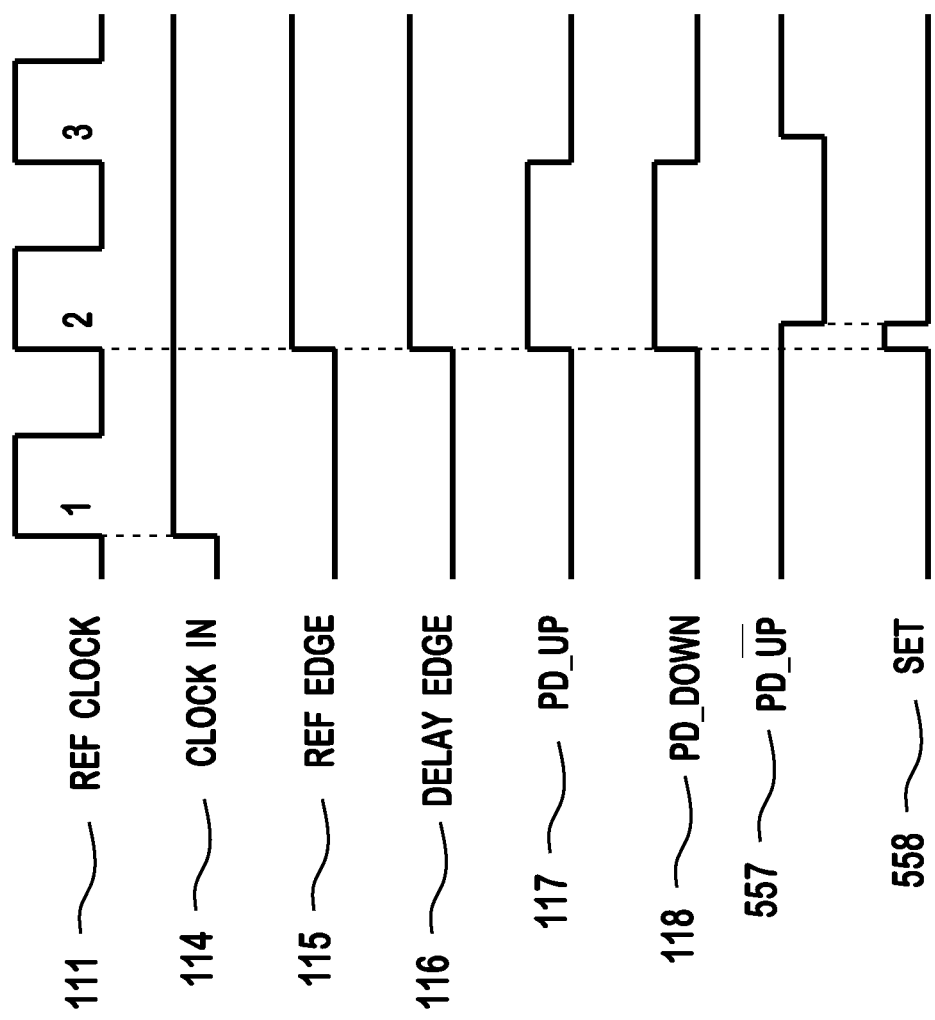

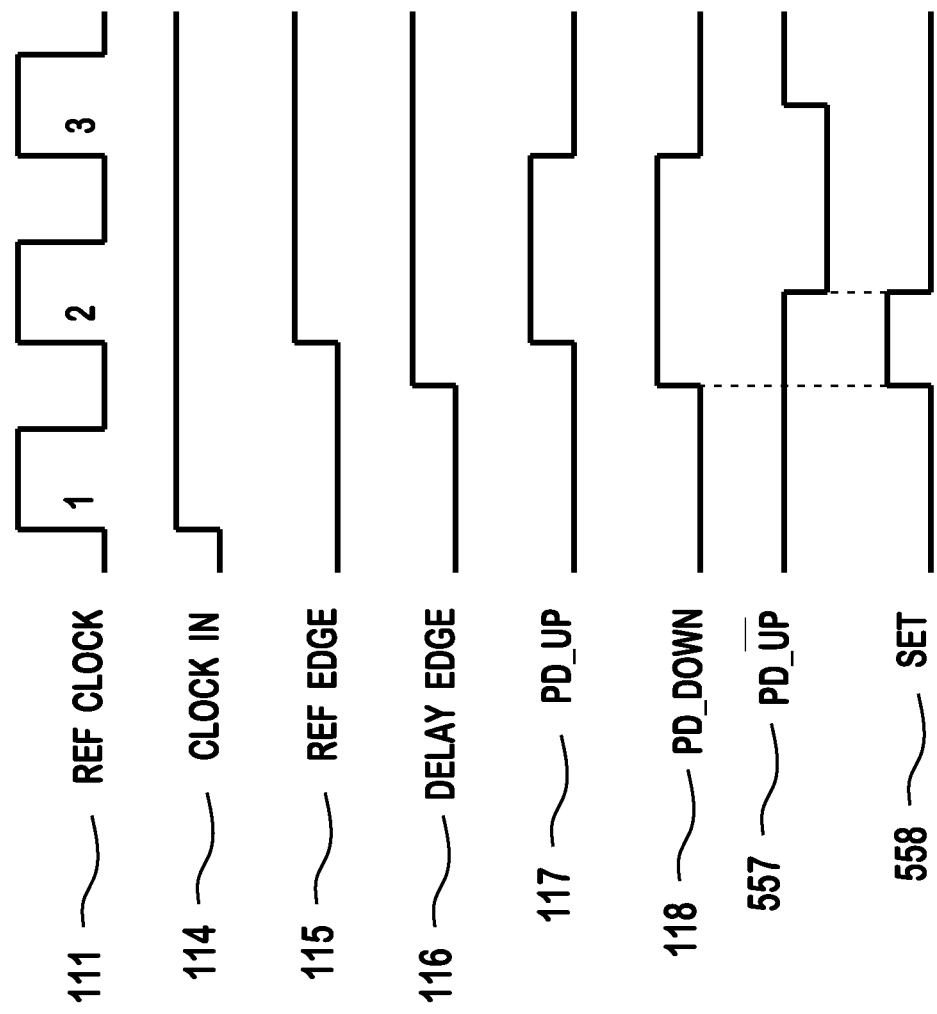

METHOD FOR LOCKING A DELAY LOCKED LOOP

FIELD OF INVENTION

This application is related to locking a delay locked loop.

BACKGROUND

The primary function of a Delay Locked Loop (DLL) is to provide a way to divide time up into stable, equal pieces. This is done by taking a variable delay line and locking its delay to a stable time period (generally a phase or period of an input clock). Due to the construction of the DLL, an aliasing problem arises in locking the delay line to the input clock reference. In general, if the delay line starts at a delay that is sufficiently longer than the reference time period, the delay line can falsely lock to twice the reference delay or simply fail to lock entirely. As such, most DLLs lock by starting at the minimum delay setting and then letting the delay line slow down, gradually extending the delay setting, to match the reference period.

By initially forcing the delay line to a minimum delay, it is required that the circuits around the DLL be able to keep up with the high speed edges and pulses that the delay line produces. This can require that the support circuitry around the DLL operate at much higher data rates than is otherwise required. This will generally cause the support circuits to consume much more power during the lock in period of the delay line and even after the delay lock is achieved due to the need to overdesign for a worst case start at minimum delay. Another challenge to operation of the DLL at minimum delay is pulse evaporation, which occurs when the input to the delay line toggles faster than the delay line can handle.

SUMMARY OF EMBODIMENTS

A method and apparatus for locking a delay locked loop (DLL) is disclosed. This DLL may achieve delay lock from any starting delay state of the delay line, including the longest delay state, such as one clock period or greater. An injector allows only a single edge of a reference clock to enter a delay line, the output of which is then synchronized to the reference clock by a synchronizer. After the first edge has traversed the delay line and has been synchronized, another edge is allowed to enter the delay line. Once lock to the desired reference period is established, all edges of the reference clock are allowed to enter the delay line.

BRIEF DESCRIPTION OF THE DRAWINGS

FIGS. 6A-6C show a example timing diagrams of rise and fall edges for the synchronizer shown in FIG. 5.

DETAILED DESCRIPTION OF THE EMBODIMENTS

Figure 1:
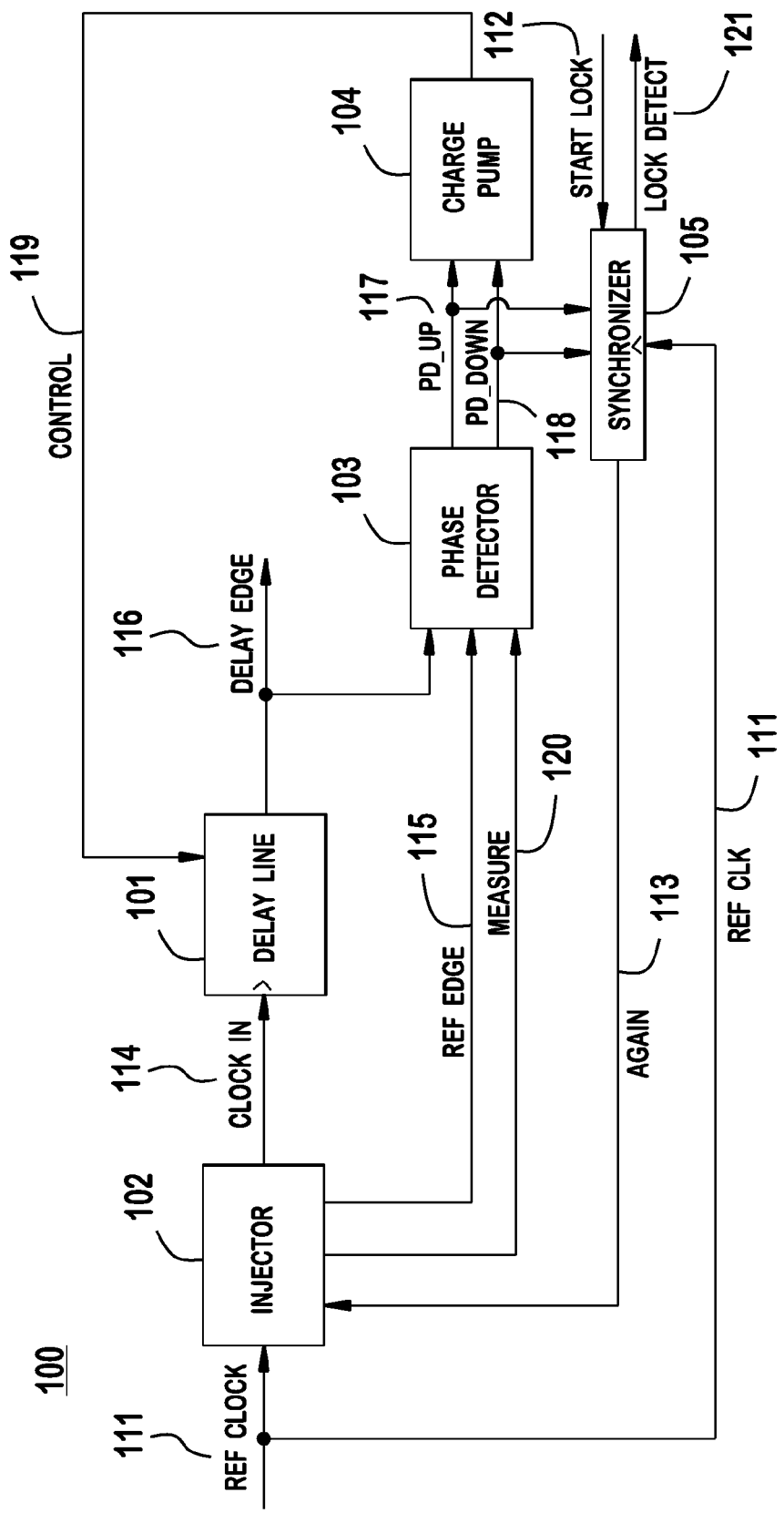
FIG. 1 shows an example functional block diagram of a delay locked loop circuit.

A first embodiment is now described with reference to FIGS. 1 and 2. FIG. 1 shows an example delay locked loop (DLL) circuit 100 that ensures one and only one rise edge of a clock pulse is injected into a delay line 101. The DLL circuit 100 further includes an injector 102, a phase detector 103, a charge pump 104, and a synchronizer 105. The DLL circuit 100 is configured to operate such that an initial delay can be set to the maximum value and by iterative adjustments, the delay can be reduced until the lock in value is achieved. This avoids the aforementioned problems encountered when setting the initial delay to a minimum value (i.e., initially running the DLL as fast as possible). The REF CLOCK 111 signal is the clock input for the DLL circuit 100 and is controlled by the injector 102 until such time it is determined by the phase detector 103 and synchronizer 105 that the delay line 101 has been adjusted properly using control signal 119. While the injector 102 controls the REF CLOCK 111 signal, only a single rise edge or a single fall edge is sent as CLOCK IN 114 signal to the delay line 101 after waiting for the DLL circuit to analyze the synchronization of the delay line 101 against the CLOCK IN 114 signal pulse. Once the delay line 101 has been adjusted to an acceptable delay and properly synchronized, the delay setting can be locked in, and the injector 102 can relinquish control of REF CLOCK 111, allowing the REF CLOCK 111 to directly drive the delay line 101. This process is explained in further detail below.

Figure 2:
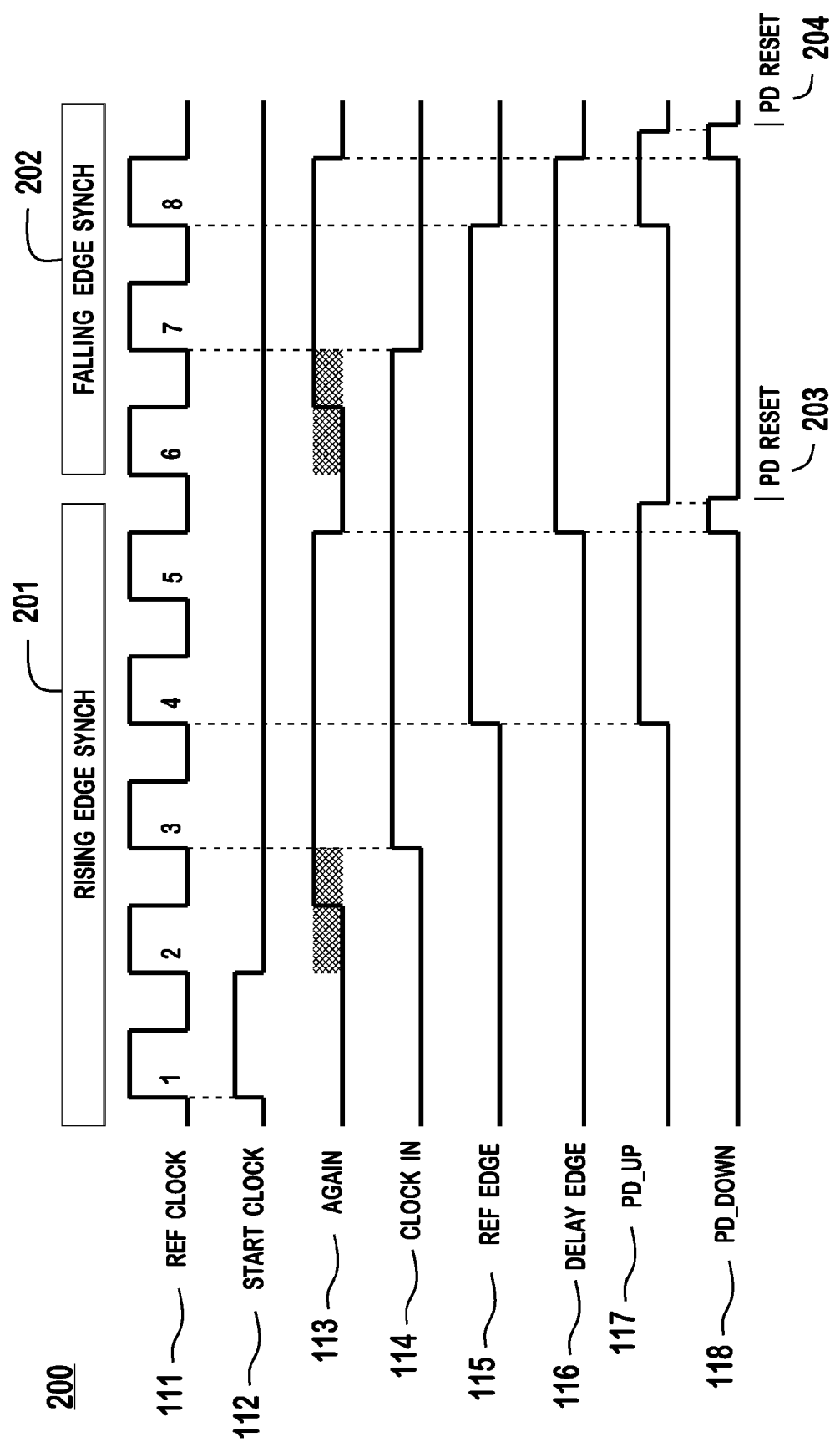
FIG. 2 shows an example timing diagram of rise and fall edges for output signals generated by the circuit elements shown in FIG. 1.

FIG. 2 shows an example signal pulse timing diagram 200 for the various input and output signals in the DLL circuit 100. The timing diagram 200 includes a rise edge synch 201 (shown occurring for pulses 1-5 of the REF CLOCK 111) and a fall edge synch 202 (shown occurring for pulses 6-8 of REF CLOCK 111), which refers to the single pulse for the CLOCK IN signal 114 that is input to the delay line 101.

The injector 102 receives the REF CLOCK signal 111 and injects a single edge as the CLOCK IN signal 114 into the delay line 101. This allows the DLL circuit 100 to perform a synchronization between the delay signal DELAY EDGE 116 to the REF CLOCK signal 111, using a corresponding rise edge shown as REF EDGE 115 from the injector 102 during the rise edge synch 201. Likewise, for the fall edge synch 202, the fall edge of the REF EDGE 115 and the fall edge of the DELAY EDGE signal 116 are processed. The phase detector 103 and the synchronizer 105 determine a phase difference between the REF EDGE 115 and the DELAY EDGE 116, and the charge pump 104 produces a control signal 119 to adjust the delay in the delay line 101. This process will now be presented in greater detail.

The REF CLOCK signal 111 is an input system clock signal from which the DLL circuit 100 is to produce unit delay pulses, or possibly fractional delays using a particular tap within the delay line as a reference point. A START LOCK signal 112 initiates the DLL processing at the synchronizer 105, shown at pulse 1 of REF CLOCK 111, which triggers an AGAIN signal 113, at some instance during pulse 2. Once the injector 102 receives the AGAIN signal 113, and upon the next rise edge (pulse 3) of the REF CLOCK 111, a rise edge of CLOCK IN signal 114 is sent to the delay line 101, shown synchronized with the rise edge of REF CLOCK 111 pulse 3. The rise edge of CLOCK IN signal 114 can be triggered using AND or NAND gate logic of the AGAIN 113 and the REF CLOCK 111 signals at injector 102. Alternatively, CLOCK IN signal 114 rise edge can be triggered by a fall edge of the REF CLOCK 111, such as the fall edge of pulse 3 of REF CLOCK 111.

For a delay line 101 designed for a 1.0 clock period delay, a delay of one clock period is added to CLOCK IN signal 114 by the injector 102 for setting the edge of REF EDGE signal 115 and for sending a REF EDGE signal 115 to the phase detector 103, as the first rise edge to be analyzed for setting the delay adjustment. After the delay line 101 adds a delay to the CLOCK IN signal 114 according to the present settings of the delay line 101, a DELAY EDGE pulse 116 is produced including error caused by various factors, such as temperature and voltage fluctuations. The rise edge of DELAY EDGE 116 is shown to occur during pulse 5 of REF CLOCK 111.

The phase detector 103 receives the pulse of DELAY EDGE signal 116, and can now compare it to the REF EDGE signal 115 so that the phase difference can be determined. To do this, a PD_UP signal 117 is triggered upon receiving the REF EDGE signal 115, as shown at the rise edge of REF CLOCK 111 pulse 4. The DELAY EDGE pulse 116 triggers a PD_DOWN pulse 118, as shown at the fall edge of REF CLOCK pulse 5. Therefore, the measured phase difference for this example would be a 1.5 clock period (i.e., the difference between 5.5 and 4.0). Note that FIG. 2 is drawn with pulses occurring at 0.5 clock period intervals, for simplicity and convenience in this description. Actual DELAY EDGE 116 edges (and consequently, PD_DOWN 118 edges) may occur at a fractional clock period resolution that would be detectable at the phase detector 103 for any fractional delay value.

Recall that the REF EDGE signal 115 has a one clock period delay added from the CLOCK IN 114 pulse. This permits the phase difference calculation by the phase detector 103 to deal with a delay of exactly one clock period. For example, when the delay is exactly one period, the REF EDGE 115 and DELAY EDGE 116 occur at the same time, and so do signals PD_UP 117 and PD_DOWN 118, to produce a phase difference of zero. Thus, the REF EDGE signal 115 provides a buffer for the CLOCK IN signal 114, permitting additional control of the processing and delay synchronization of the clock pulses. Alternatively, the DLL circuit 100 can be modified to omit the REF EDGE signal 115, and instead allow the injector 102 to send the CLOCK IN signal 114 directly to the phase detector 103.

When the phase detector 103 has detected both a rise edge of the DELAY EDGE 116 and a rise edge of the REF EDGE 115, the PD_UP signal 117 and the PD_DOWN signal 118 are allowed to reset to zero, shown by PD Reset 203 during pulse 5 of REF CLOCK 111. With the reset of the phase detector 103, it is ready to perform the next phase detection during the fall edge synch 202.

The charge pump 104 receives the PD_UP signal 117 and the PD_DOWN signal 118, analyzes the timing difference between them as the delay line 101 error, and produces a control signal 119, which is an adjustment signal to the delay line 101 to either slow down or speed up the output signal DELAY EDGE 116 (i.e., lengthen the delay or shorten the delay added to the CLOCK IN signal 114).

The synchronizer 105 also receives the PD_UP signal 117 and the PD_DOWN signal 118 from the phase detector 102. Upon detection of both a PD_UP signal 117 and a PD_DOWN signal 118, the synchronizer 105 determines that the rise edge synchronization of the CLOCK IN signal 114 has been completely processed. The AGAIN signal 113 can then be reset to zero, shown during pulse 5 of REF CLOCK 111, and then set to one after a period of time that allows for demetastabilization of the AGAIN signal into the REF CLOCK 111 clock domain, which is shown by the shaded region during pulse 6 or REF CLOCK 111. Once the AGAIN signal 113 goes to a value of one, the CLOCK IN signal 114 fall edge can be triggered to commence fall edge synch 202.

During the fall edge synch 202, the injector 102 passes the next rise edge of the REF CLOCK signal 111 into the delay line 101 upon receiving a trigger AGAIN signal 113. This triggers a fall edge of the CLOCK IN signal 114, shown to occur at the next rise edge (pulse 7) of REF CLOCK 111. Alternatively, the fall edge of CLOCK IN signal 114 could be triggered upon a fall edge of REF CLOCK 111, such as at pulse 6 or 7. As with the rise edge of CLOCK IN signal 114, the fall edge of CLOCK IN signal 114 can be controlled by the same AND or NAND gate logic in the injector 102. By waiting for the first rise edge of CLOCK IN signal 114 to exit the DL 101 before sending in the fall edge, pulse evaporation of the clock signal due to running the DL 101 too rapidly is avoided. The DELAY EDGE 116 rise edge indicates that a rise edge of the CLOCK IN 114 has been injected into the DL 101, and has been processed to produce the DELAY EDGE 116 signal pulse.

Following the fall edge of the CLOCK IN signal 114, after a delay equal to the target delay for the delay line 101 (shown in this example as 1.0 clock pulse delay), the injector 102 sends a fall edge of the REF EDGE signal 115 pulse to the phase detector 103, as the first fall edge to be analyzed for setting the delay adjustment. After the delay line 101 adds a delay to the CLOCK IN signal 114, according to the present settings of the delay line 101 along with any of the aforementioned inherent error, the fall edge of the DELAY EDGE pulse 116 is produced, as shown to occur during pulse 8 of REF CLOCK 111. The phase detector 103 receives the fall edge of DELAY EDGE signal 116, and can now compare it to the fall edge of the REF EDGE signal 115 so that the phase difference can be determined. To do this, a pulse PD_UP 117 is triggered upon receiving the REF EDGE signal 115, as shown at the rise edge of REF CLOCK 111 pulse 8. The DELAY EDGE pulse 116 triggers a pulse PD_DOWN 118. When the phase detector 103 has detected both a rise edge of the DELAY EDGE 116 and a rise edge of the REF EDGE 115, the pulse PD_UP 117 and the pulse PD_DOWN 118 are again reset to zero, shown by PD Reset 204 during pulse 8 of REF CLOCK 111. With this reset of the phase detector 103, it is ready to perform the next phase detection.

It should be noted that FIG. 2 shows an example timing diagram in which the pulse PD_UP 117 precedes the pulse PD_DOWN 118. However, there may also be instances where the pulse PD_DOWN 118 occurs prior to the pulse PD_UP 117, which would indicate that delay line 101 is running faster than necessary. Such a scenario would result from the charge pump 104 having a gain value set to a high value, where the control signal 119 overshoots the desired delay value control. Upon detection of a delay around one clock period or less, the REF CLOCK 111 can enter the delay line 101 without concern for pulse evaporation in the delay line 101. Pulse evaporation may occur when the input to the delay line 101 toggles faster than the delay line 101 can handle. For example, consider a delay line 101 having eight delay elements, where the total delay for the delay line 101 is two unit intervals (2 UI) giving 0.25 UI delay per delay element. A pulse having a duration of 1 UI has a pulse width over delay element ratio of 1/0.25=4, which is guaranteed not to evaporate. As this ratio of 4 diminishes to 1, the pulse will evaporate and not go through. For example, if a pulse duration is defined to be 0.5 UI, then the ratio becomes 0.5/0.25=2, which is at a threshold for pulse evaporation. For a delay line of 3 UI, the ratio becomes 0.5/(⅜)=1.33, and pulse evaporation would occur if REF CLOCK signal is allowed to directly enter the delay line 101.

Alternatively, in order to avert an overshoot (i.e., a negative phase), the charge pump 104 may be set with a lower gain value such that the adjustments to the delay line produce a phase difference at the phase detector 103 between PD_UP 117 and PD_DOWN 118 that asymptotically approaches zero (i.e., never reaches the value of 0, and the pulse PD_DOWN 118 would never occur prior to pulse PD_UP 117, except if there is jitter present in the REFCLOCK).

The injector 102 does not send another rise edge of the CLOCK IN signal 114 to the delay line 101 until a complete pulse (i.e., one rise edge and one fall edge) of the REF EDGE signal 115 (received as pulse PD_UP 117) is detected by the synchronizer 105. By delaying the injection of a second CLOCK IN 114 pulse until after a first CLOCK IN pulse 114 has passed through the delay line 101, there is no ambiguity over the total delay and it avoids a false lock to 2, 3, or 4 times the period of the REF CLOCK 111.

For both rise edge synch 201 and fall edge synch 202, a lock detect signal 121 is generated for indicating detection that the delay line 101 has been adjusted to a delay setting that is fast enough to permit REF CLOCK signal 111 to become the direct input for the delay line 101 with assurance that pulse evaporation will not occur. The lock detect signal 121 also indicates that a continuous REF CLOCK signal 111 can become the direct and continuous input of the delay line 101, without having the injector 102 send one edge at a time.

The synchronizer 105 determines a lock detect condition once the phase difference between the DELAY EDGE 116 and the REF EDGE 115 has reached a predetermined threshold, such as 0 UI or less, for example. This threshold is appropriate in a case where the charge pump 104 gain control is set with an under-damped response, which allows the delay adjustment to overshoot the appropriate delay. On the other hand, should the charge pump 104 gain control be set with an over-damped response, where the threshold is only approached, but not reached, then the threshold should be fractionally greater than 0 UI, such as 0.1 UI for example. Otherwise, if the threshold is set to be equal to 0 UI, the lock detect can never occur.

The delay line 101 can lock in the delay after the rise edge synch 201 is performed and a lock detect signal 121 is detected, at which time the fall edge synch 202 can be aborted. If the phase difference does not reach the acceptable level after one rise edge synch 201 and one fall edge synch 202, the DLL circuit 100 continues the process for as many cycles as necessary. Upon detection of the lock detect 121 signal, the synchronizer 105 can be de-energized, and control of the delay line 101 carries on using the phase detector 103 and the charge pump 104.

In the case where a proportional error signal is produced (as in the case of a charge pump 104), rapid convergence will still occur when the delay line 101 commences lock from maximum delay. This is because the control signal 119 will continuously drive down the delay in the delay line 101 until the one input edge emerges on the DELAY EDGE signal 116. As soon as a PD_UP 117 or PD_DOWN 118 asserts, the analog charge pump 104 changes control signal 119 which begins modifying the delay on the DL 101. In the case where the phase detector 103 is a bang-bang type phase detector, either longer convergence times will need to be tolerated, or non-linear loop gain will need to be employed.

As mentioned above, by processing a rise edge synch 201 and a fall edge synch 202, there are two opportunities within a single injected REF CLOCK 111 pulse to lock the delay to the REF CLOCK 111. Alternatively, only rise edge synch 201 could be applied exclusively, or fall edge synch 202 exclusively, where in either case, the DLL lock-in period would double.

Figure 3:
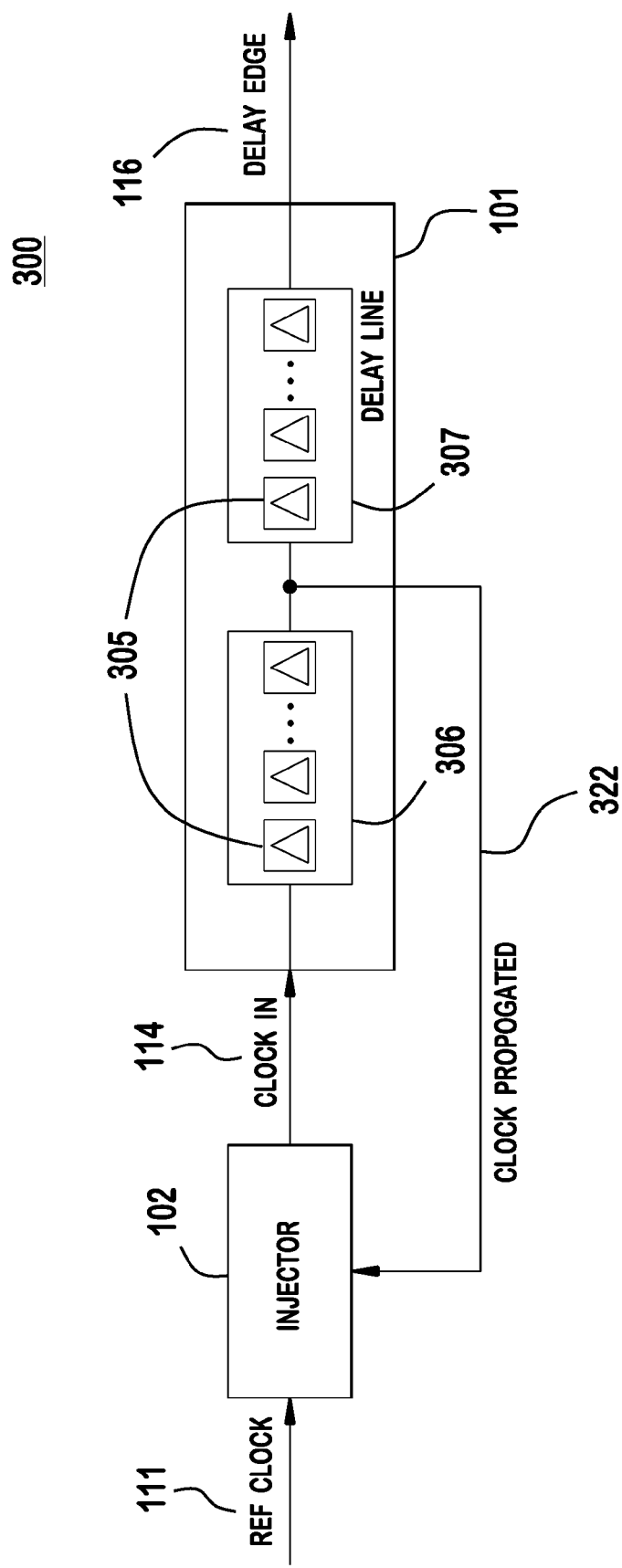
FIG. 3 shows an example functional block diagram of a tapped delay line for determining a fractional delay rise edge propagation.

FIG. 3 shows a circuit 300 as an alternative arrangement of the delay line 101, in which the DLL circuit 100 can take advantage of a delay line 101 having n delay elements 305, each having a delay value Δ, and arranged in series to produce a total delay value DL. By tapping the delay line at any point, a fractional delay may be extracted from the delay line 101 to accelerate the phase detection, where it may be predetermined that after waiting for a delay produced by at least three delay elements 305, for example, following injection of a rise edge of CLOCK IN 111, it is safe to send the next edge without risk of pulse evaporation. Thus, the predetermined number of delay elements may be based on a minimum pulse value to avoid pulse evaporation. This alternative approach avoids waiting for the entire delay value DL of delay line 101 before sending another rise or fall edge, as was the case in the description of FIGS. 1 and 2 presented above. Also, in using this alternative approach, the DLL circuit 100 may successfully operate to synchronize the delay line 101 while using only a rise edge synch 201.

As shown in FIG. 3, a clock propagated signal 322 is generated as a tap of the delay line 101. The delay elements 305 are divided as a first delay unit 306, having a fractional delay value equal to αDL, where α is less than 1, and a second delay unit 307 produces the remainder of the total delay of the delay line 101 (i.e., (1−α)DL). For example, the tap may by configured such the first delay unit 306 consists of n/2 delay elements 305, and the second delay unit 307 consists of n/2 delay elements 305 (i.e., α=½). In operation, the first delay unit 306 receives the CLOCK IN 114 signal from the injector 102 and generates a fractional delay equal to (α·DL). A second delay unit 307 produces the remainder of the total delay of the delay line 101 (i.e., (1−α)DL), for a total delay value of DL at the output DELAY EDGE signal 116. The tap for Clock Propagated signal 322 is between the first delay unit 306 and the second delay unit 307.

Figure 4:
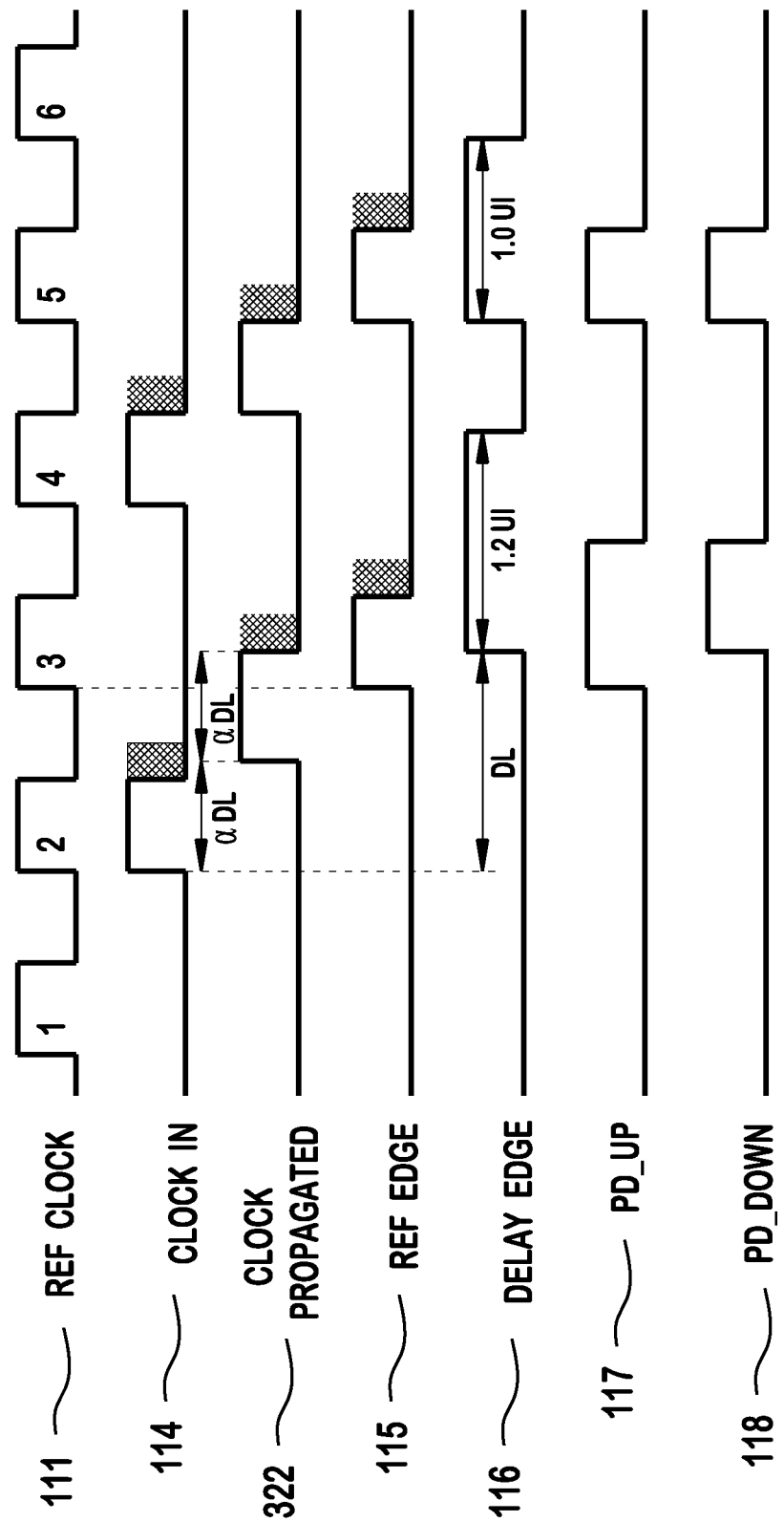
FIG. 4 shows an example timing diagram of rise and fall edges for the tapped delay line shown in FIG. 3.

FIG. 4 shows a signal diagram 400 for the circuit 300, for an example in which α=½. The first CLOCK IN 114 rise edge is shown aligned with pulse 2 of the REF CLOCK 111. The Clock Propagated signal 322 is initiated following the fractional delay α·DL. The REF EDGE 115 pulse is delayed by one clock period of REF CLOCK 111 just as described above with respect to FIGS. 1 and 2. Following the total delay DL along with any inherent error, the DELAY EDGE 116 rise edge occurs, shown during pulse 3 of the REF CLOCK 111. For this first pulse of DELAY EDGE 116, the delay of delay line 101 is set at greater than 1.0 clock period (i.e., 1.2 UI), hence the pulse PD_UP 117 asserts before the pulse PD_DOWN 118. When a second CLOCK IN 114 is injected at pulse 4 of the REF CLOCK 111, the Clock Propagated signal 322, the REF EDGE 115 pulse follow as with the first signal pulse of CLOCK IN 114. Now the delay of delay line 101 has been adjusted to a shorter delay which is 1.0 UI, where pulse PD_UP 117 and pulse PD_DOWN 118 are aligned as a result.

Figure 5:
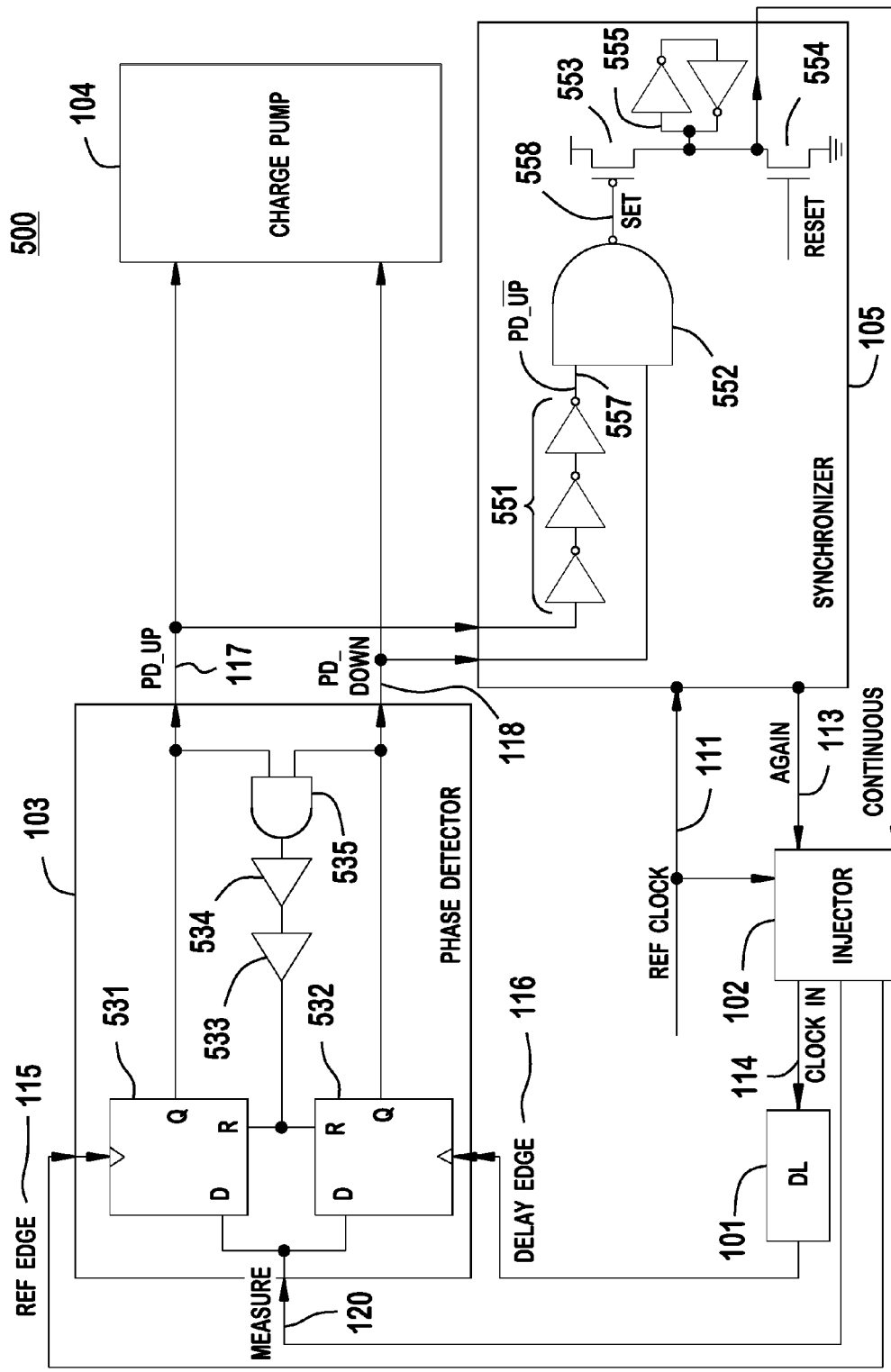
FIG. 5 shows an example functional block diagram of a delay locked loop circuit that includes a triggered synchronizer output signal to maintain synchronization with the reference clock rise edge.

FIG. 5 shows a DLL circuit 500 in which the synchronizer 105 further includes circuitry to produce a Continuous signal 523 to trigger the injector 102 to commence sending every pulse of REF CLOCK 101 as CLOCK IN 114 to the delay line 101. The Continuous signal 523 is triggered on a condition that PD_DOWN signal 118 asserts at a delay value not more than three inverter delays elements 551 after the PD_UP signal 117, indicating that the delay line is set to a delay of approximately 1.0 clock period or less, and can tolerate the REF CLOCK 111 clock period directly (i.e., the delay line is synchronized to the 1.0 clock period of the REF CLOCK 111). The synchronizer 105 is arranged with a series of inverters 551 that add a delay to the signal PD_UP 117, producing signal PD_$\overline{\text{UP}}$ 557, which is an inverted and delayed pulse of PD_UP 117. A NAND gate 552 receives PD_DOWN 118 and signal PD_$\overline{\text{UP}}$ 557, and sends the SET signal 558 to the latch switch 553 for triggering the Continuous signal 523. The latch switch 553 is shown in this example as a PMOS device, but any equivalent switching device may be substituted. The latch switch 553 operates the latch 555. The additional delay provided by inverters 551 allows the latch switch 553 to assert the Continuous signal 523 when the delay of delay line 101 is just above 1.0 clock period of REF CLOCK 111, which is certain to be crossed when the delay of delay line 101 is being decreased. The number of inverters 551 may vary in accordance with any process manufacturing tolerances present in the delay elements of delay line 101.

FIG. 5 also shows an example phase detector 103 in further detail, including a D-type flip-flop 531 to convert the DELAY EDGE 116 to PD_UP 117, and a D-type flip-flop 532 to convert REF EDGE 115 to PD_DOWN 118. While a D-type flip-flops are illustrated, other suitable flip-flop devices may be substituted. The phase detector 103 also includes an AND gate 535 for resetting PD_UP 117 signal and PD_DOWN 118 signal upon detecting both pulses, by coupling the output of the AND gate 535 to the Resets of flip-flops 531 and 532. Delay elements 533 and 534 ensure a minimum pulse width for PD_DOWN 118, which is equal to a delay value of the delay elements 533 and 534 plus flip-flop 531 and 532 and the delay of AND gate 535. A Measure signal 120 is received as an input at flip-flops 531 and 532, triggered by the injector 102 according to a moment when the phase detector should be ready to detect DELAY EDGE 116 and REF EDGE 115. For example, the Measure signal 120 may be synchronized with CLOCK IN 114 as a convenient trigger for injector 102.

Figure 6A:
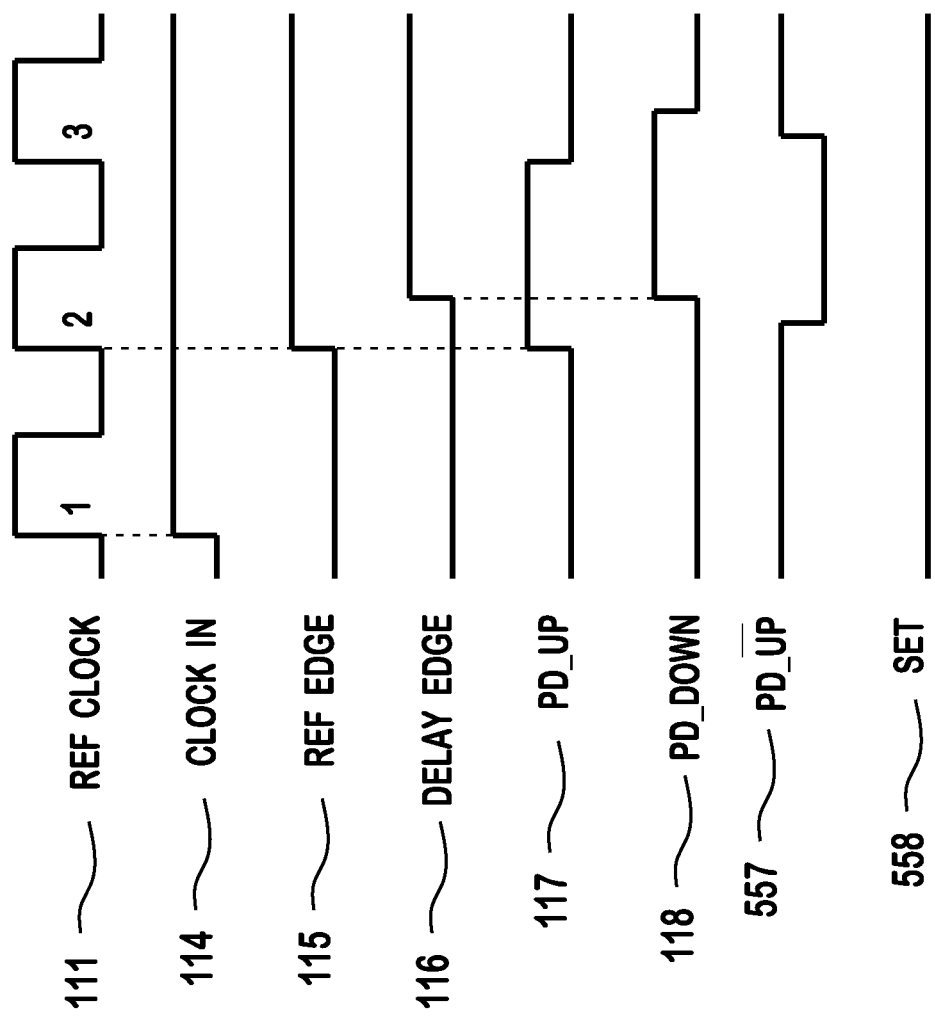

FIGS. 6A-6C show a signal diagrams of the synchronizer signals shown in FIG. 5 for various delay settings of the delay line 101. In FIG. 6A, the delay setting of delay line 101 is sufficiently greater than 1.0 clock period to not be considered locked (i.e., DL>1.0 UI+delay of inverters 551). Consequently, the pulse PD_UP 117 leads the pulse PD_DOWN 118. Pulse PD_UP 117 is triggered in response to DELAY EDGE signal 116, and pulse PD_DOWN 118 is triggered in response to REF EDGE 115. The signal PD_$\overline{\text{UP}}$ 557 responds after the delay of inverters 551, such that a fall edge occurs. The Set signal 558 pulse is not triggered because PD_$\overline{\text{UP}}$ 557 goes low before PD_DOWN 118 goes high.

In FIG. 6B, REF EDGE 115 and DELAY EDGE 116 both occur at rise edge of pulse 2 of REF CLOCK 111, indicating that the delay line 101 setting is exactly 1.0 clock period, matching the built-in delay for REF EDGE of 1.0 clock period. FIG. 6B shows PD_DOWN 118 rising before PD_$\overline{\text{UP}}$ 557 can fall due to delay inverters 551, allowing for SET 558 to assert a high pulse and cause Continuous signal 523 to be asserted.

In FIG. 6C, the delay of the delay line 101 is set below 1.0 clock period, causing the pulse PD_DOWN 118 to lead the pulse PD_UP 117. Consequently, the pulse duration of Set signal 558 increases further than shown in FIG. 6B. As demonstrated by FIGS. 6A-6C, the inverters 551 assure that the pulse duration of Set signal 558 is long enough to trip the latch switch 553 and detect that the delay line is close to locking at 1 UI delay. The Continuous signal 523 is triggered following the delay of inverters 551 and prior to the delay of delay line 101 reaching less than 1.0 clock period of REF CLOCK 111.

In summary, the DLL circuit 100 may reduce current consumption for the delay lock by starting at any delay line state, including the maximum delay period, which eliminates the need to precondition the delay line 101 to a minimum delay before starting lock of the delay line 101. Implementation of the DLL circuit 100 permits the delay line 101 to be set up to a maximum delay prior to lock. In doing so, the DLL circuit 100 also eliminates the need to have support circuitry in the DLL operating at worst case minimum delay times. The DLL circuit 100 cannot falsely lock to anything but the selected reference period. The DLL circuit 100 includes an inherent lock detection signal 121 and a time to lock indication.

Figure 7:
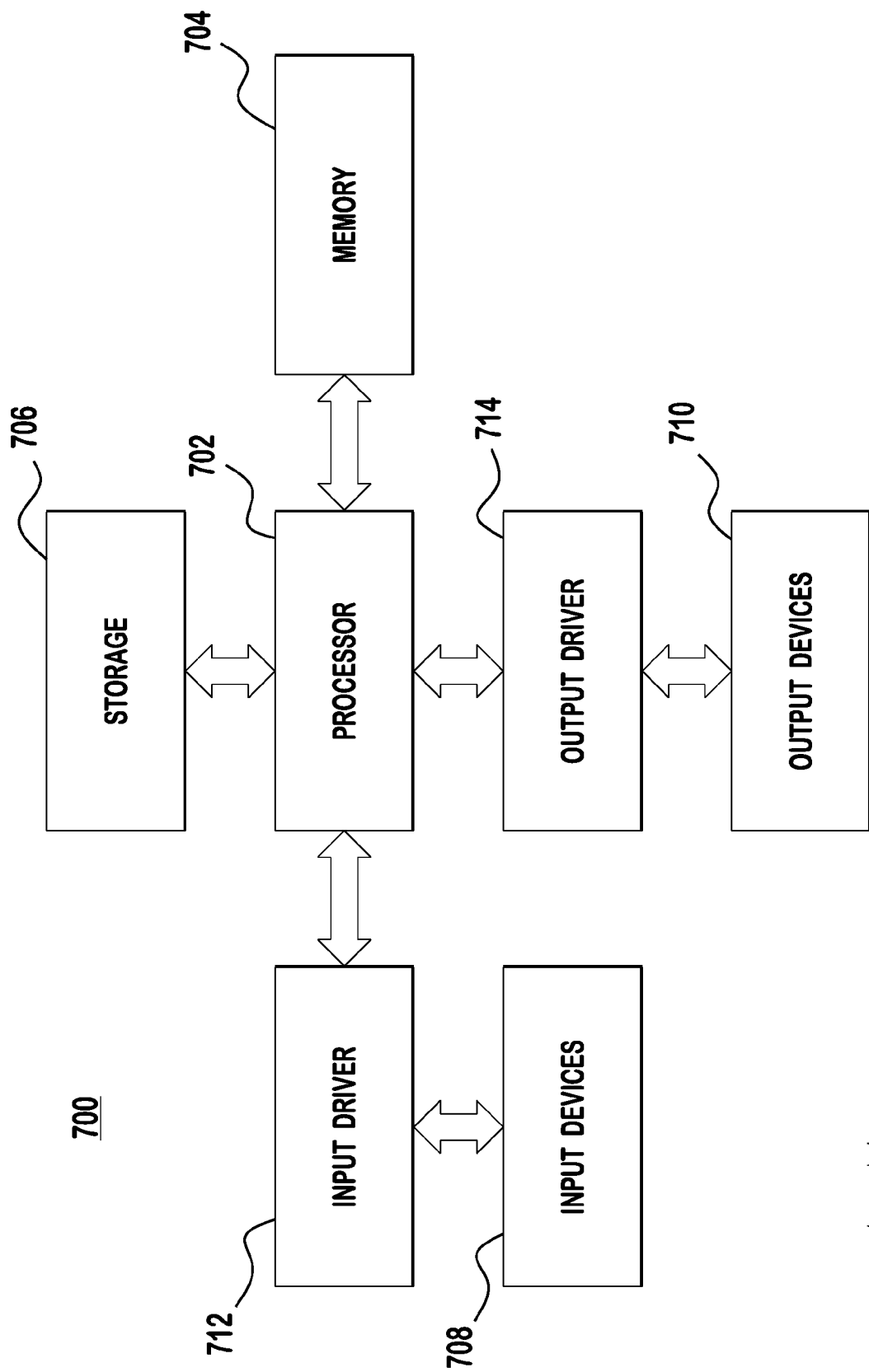
FIG. 7 shows a block diagram of an example device in which one or more disclosed embodiments may be implemented.

FIG. 7 is a block diagram of an example device 700 in which one or more disclosed embodiments may be implemented. The device 700 may include, for example, a computer, a gaming device, a handheld device, a set-top box, a television, a mobile phone, or a tablet computer. The device 700 includes a processor 702, a memory 704, a storage 706, one or more input devices 708, and one or more output devices 710. The device 700 may also optionally include an input driver 712 and an output driver 714. It is understood that the device 700 may include additional components not shown in FIG. 7.

The processor 702 may include a central processing unit (CPU), a graphics processing unit (GPU), a CPU and GPU located on the same die, or one or more processor cores, wherein each processor core may be a CPU or a GPU. The memory 704 may be located on the same die as the processor 702, or may be located separately from the processor 702. The memory 704 may include a volatile or non-volatile memory, for example, random access memory (RAM), dynamic RAM, or a cache. The DLL circuit 100 may be implemented in the processor 702 to control timing of various processes, such as using the delay line 101 to send delayed clock signals to the memory 704 for controlling buffered information flow, for example.

The storage 706 may include a fixed or removable storage, for example, a hard disk drive, a solid state drive, an optical disk, or a flash drive. The input devices 708 may include a keyboard, a keypad, a touch screen, a touch pad, a detector, a microphone, an accelerometer, a gyroscope, a biometric scanner, or a network connection (e.g., a wireless local area network card for transmission and/or reception of wireless IEEE 802 signals). The output devices 710 may include a display, a speaker, a printer, a haptic feedback device, one or more lights, an antenna, or a network connection (e.g., a wireless local area network card for transmission and/or reception of wireless IEEE 802 signals).

The input driver 712 communicates with the processor 702 and the input devices 708, and permits the processor 702 to receive input from the input devices 708. The output driver 714 communicates with the processor 702 and the output devices 710, and permits the processor 702 to send output to the output devices 710. It is noted that the input driver 712 and the output driver 714 are optional components, and that the device 700 will operate in the same manner if the input driver 712 and the output driver 714 are not present. The DLL circuit 100 implemented in processor 702 may also be used to control timing between the processor 702 and the input driver 712, input devices 708, output driver 714, and/or output devices 710.

Although features and elements are described above in particular combinations, each feature or element may be used alone without the other features and elements or in various combinations with or without other features and elements. The apparatus described herein may be manufactured by using a computer program, software, or firmware incorporated in a computer-readable storage medium for execution by a general purpose computer or a processor. Examples of computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

Embodiments of the present invention may be represented as instructions and data stored in a computer-readable storage medium. For example, aspects of the present invention may be implemented using Verilog, which is a hardware description language (HDL). When processed, Verilog data instructions may generate other intermediary data (e.g., netlists, GDS data, or the like) that may be used to perform a manufacturing process implemented in a semiconductor fabrication facility. The manufacturing process may be adapted to manufacture semiconductor devices (e.g., processors) that embody various aspects of the present invention.

Suitable processors include, by way of example, a general purpose processor, a special purpose processor, a conventional processor, a digital signal processor (DSP), a plurality of microprocessors, a graphics processing unit (GPU), a DSP core, a controller, a microcontroller, application specific integrated circuits (ASICs), field programmable gate arrays (FPGAs), any other type of integrated circuit (IC), and/or a state machine, or combinations thereof.

What is claimed is:

1. A delay locked loop, comprising:
a delay line configured to receive a clock input signal based on a reference clock and to output a delay edge signal according to a control signal adjustment;
an injector configured to receive a rise edge of the reference clock and, in response to a trigger, send a single rise edge of the clock input signal to the delay line and generate a rise edge of a reference edge signal delayed by a predetermined unit of the reference clock period;
a synchronizer configured to determine that the rise edge has passed through the delay line, and in response, send the injector a second trigger to send a next single fall edge of the clock input signal to the delay line; and
a charge pump configured to calculate a timing difference by comparing a timing of a rise edge from the delay edge signal to a timing of a rise edge of the reference edge signal, and to send the control signal to the delay line to decrease or increase a delay setting of the delay line based on the timing difference.

2. The delay locked loop of claim 1, wherein
the injector is further configured to send a single fall edge of the clock input signal to the delay line, and to generate a fall edge of the reference edge signal delayed by a predetermined unit of the reference clock period;
the synchronizer is further configured to determine that the fall edge has passed through the delay line, and in response, send the injector a third trigger to send a next rise edge of the clock input signal to the delay line; and
the charge pump is further configured to calculate a timing difference by comparing a timing of a fall edge from the delay edge signal to a timing of the fall edge of the reference edge signal, and to send the control signal to the delay line to decrease or increase a delay setting of the delay line based on the timing difference.

3. The delay locked loop of claim 1,
wherein the synchronizer further comprises a latch switch that operates in response to a set signal,
wherein the set signal is produced in response to the delay edge signal rising at a time equal to or prior to the reference edge signal rising; and
wherein the latch switch triggers a control signal sent to the injector to allow direct input of the reference clock to the delay line.

4. The delay locked loop of claim 3, wherein the synchronizer further comprises a plurality of inverters to provide additional delay to the reference edge signal in accordance with process manufacturing tolerances of the delay line, such that the latch switch triggers when the delay setting of the delay line is approximately 1.0 clock period of the reference clock.

5. The delay locked loop of claim 1, wherein the injector receives a clock propagated input signal that is sent via a tap of the delay line as a trigger to the injector that the delay line has received a clock input signal and is ready to receive the next clock input signal.

6. The delay locked loop of claim 1, wherein the delay line is initially set at a maximum delay and receives at least one control adjustment to decrease the delay until the synchronizer determines that the delay line is synchronized to the reference clock.

7. A method for setting a delay locked loop, comprising:
generating a delay edge signal at a delay line according to a control signal adjustment using a received clock input signal of a reference clock;
in response to a trigger, sending a single rise edge of the clock input signal to the delay line from a received rise edge of the reference clock;
generating a rise edge of a reference edge signal delayed by a predetermined unit of the reference clock period;
determining that the rise edge has passed through the delay line, and in response, sending the injector a second trigger to send a next single fall edge of the clock input signal to the delay line;
calculating a timing difference by comparing a timing of a rise edge from the delay edge signal to a timing of a rise edge of the reference edge signal; and
sending the control signal to the delay line to decrease or increase a delay setting of the delay line based on the timing difference.

8. The method of claim 7, further comprising:
sending a single fall edge of the clock input signal to the delay line;
generating a fall edge of the reference edge signal delayed by a predetermined unit of the reference clock period;
determining that the fall edge has passed through the delay line, and in response, sending the injector a third trigger to send a next rise edge of the clock input signal to the delay line; and
calculating a second phase difference by comparing a timing of a fall edge from the delay edge signal to a timing of the fall edge of the reference edge signal; and
sending the control signal to the delay line to decrease or increase a delay setting of the delay line based on the second phase difference.

9. The method of claim 7, further comprising:
operating a latch switch in response to a set signal,
wherein the set signal is produced in response to the delay edge signal and rising at a time equal to or prior to the delayed inverse of the reference edge signal; and
wherein the latch switch triggers a control signal sent to the injector to allow direct input of the reference clock to the delay line.

10. The method of claim 7, further comprising:
using a plurality of inverters to provide additional delay to the reference edge signal in accordance with process manufacturing tolerances of the delay line, such that the latch switch triggers when the delay setting of the delay line is approximately 1.0 clock period of the reference clock.

11. The method of claim 7, wherein the injector receives a clock propagated input signal that is sent via a tap of the delay line as a trigger to the injector that the delay line has received a clock input signal and is ready to receive the next clock input signal.

12. The method of claim 7, further comprising initially setting the delay line at a maximum delay and receiving at least one control adjustment to decrease the delay until determining that the delay line is synchronized to the reference clock.

13. The method of claim 7, further comprising initially setting the delay line at a delay greater than 1.0 clock period of the reference clock and receiving at least one control adjustment to decrease the delay until determining that the delay line is synchronized to the reference clock.

14. A processor, comprising:
a memory; and
a delay locked loop, comprising:
   a delay line configured to receive a clock input signal based on a reference clock and to output a delay edge signal according to a control signal adjustment;
   an injector configured to receive a rise edge of the reference clock and in response to a trigger, send a single rise edge of the clock input signal to the delay line, and generate a rise edge of a reference edge signal delayed by a predetermined unit of the reference clock period;
   a synchronizer configured to determine that the rise edge has passed through the delay line, and in response, send the injector a second trigger to send a next single fall edge of the clock input signal to the delay line; and
   a charge pump configured to calculate a timing difference by comparing a timing of a rise edge from the delay edge signal to a timing of a rise edge of the reference edge signal, and to send the control signal to the delay line to decrease or increase a delay setting of the delay line based on the timing difference.

15. The processor of claim 14, wherein
the injector is further configured to send a single fall edge of the clock input signal to the delay line, and to generate a fall edge of the reference edge signal delayed by a predetermined unit of the reference clock period;
the synchronizer is further configured to determine that the fall edge has passed through the delay line, and in response, send the injector a third trigger to send a next rise edge of the clock input signal to the delay line; and
the charge pump is further configured to calculate a timing difference by comparing a timing of a fall edge from the delay edge signal to a timing of the fall edge of the reference edge signal, and to send the control signal to the delay line to decrease or increase a delay setting of the delay line based on the timing difference.

16. The processor of claim 14,
wherein the synchronizer further comprises a latch switch that operates in response to a set signal,
wherein the set signal is produced in response to the delay edge signal rising at a time equal to or prior to the reference edge signal rising; and
wherein the latch switch triggers a control signal sent to the injector to allow direct input of the reference clock to the delay line.

17. The processor of claim 16, wherein the synchronizer further comprises a plurality of inverters to provide additional delay to the reference edge signal in accordance with process manufacturing tolerances of the delay line, such that the latch switch triggers when the delay setting of the delay line is approximately 1.0 clock period of the reference clock.

18. The processor of claim 14, wherein the injector receives a clock propagated input signal that is sent via a tap of the delay line as a trigger to the injector that the delay line has received a clock input signal and is ready to receive the next clock input signal.

19. The processor of claim 14, wherein the delay line is initially set at a maximum delay and receives at least one control adjustment to decrease the delay until the synchronizer determines that the delay line is synchronized to the reference clock.

\* \* \* \* \*